(12) United States Patent
Lin et al.

(10) Patent No.: US 6,989,561 B2
(45) Date of Patent: Jan. 24, 2006

(54) TRENCH CAPACITOR STRUCTURE

(75) Inventors: Shian-Jyh Lin, Chia-Yi Hsien (TW); Sam Liao, Tai-Chung (TW); Chia-Sheng Yu, Taipei Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/707,264

(22) Filed: Dec. 2, 2003

(65) Prior Publication Data

US 2005/0116275 A1 Jun. 2, 2005

(51) Int. Cl.
*H01L 27/108* (2006.01)

(52) U.S. Cl. .................. 257/301; 257/303; 257/309; 257/302; 257/296; 257/300; 257/304; 257/305; 438/242; 438/243; 438/426; 438/388

(58) Field of Classification Search ............... 257/301, 257/302, 329, 303, 304, 305, 296; 438/242, 438/243, 426, 388
See application file for complete search history.

(56) References Cited

U.S. PATENT DOCUMENTS 5,365,097 A * 11/1994 Kenney ............... 257/302
6,194,755 B1 * 2/2001 Gambino et al. .......... 257/301
6,271,079 B1   8/2001 Wei et al.
6,319,787 B1 * 11/2001 Enders et al. ............ 438/386
6,440,813 B2   8/2002 Collins et al.
6,448,131 B1   9/2002 Cabral et al.

\* cited by examiner

*Primary Examiner*—Nathan J. Flynn
*Assistant Examiner*—Fazli Erdem
(74) *Attorney, Agent, or Firm*—Winston Hsu (57) ABSTRACT

A fin-type trench capacitor structure includes a buried plate diffused into a silicon substrate. The buried plate, which surrounds a bottle-shaped lower portion of the trench capacitor structure, is electrically connected to an upwardly extending annular poly electrode, thereby enabling the buried plate and the annular poly electrode to constitute a large-area capacitor electrode of the trench capacitor structure. A capacitor storage node consisting of a surrounding conductive layer, a central conductive layer and a collar conductive layer encompasses the upwardly extending annular poly electrode. A first capacitor dielectric layer isolates the capacitor storage node from the buried plate. A second capacitor dielectric layer and a third capacitor dielectric layer isolate the upwardly extending annular poly electrode from the capacitor storage node.

22 Claims, 14 Drawing Sheets

TRENCH CAPACITOR STRUCTURE

BACKGROUND OF INVENTION

1. Field of the Invention

The present invention relates to a trench capacitor, and more particularly, to a trench capacitor of a DRAM device having an increased capacitor surface area and a process of manufacture thereof.

2. Description of the Prior Art s the size of a memory cell shrinks, the chip area available for a single memory cell becomes very small. This causes reduction in capacitor area and therefore becomes a challenge for chip manufacturers to maintain adequate cell capacitance of each memory cell fabricated on a high-density memory chip.

Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

One approach currently being investigated is to use capacitor dielectric materials having relatively higher dielectric constants such as aluminum oxide ($Al_2O_3$) and so on. Other approaches seek to enhance the total surface area of the capacitor structure by modifying the geometrical layout of the storage cell. For example, U.S. Pat. No. 6,271,079 filed May 19, 1999 to Wei et al. discloses a method of forming a bottle-shaped trench capacitor with a sacrificial silicon nitride U.S. Pat. No. 6,319,787 filed Jun. 30, 1998 to Enders et al. discloses a trench capacitor having a substrate with a trench extending therein with a nested, e.g., concentric, conductive regions disposed within the trench.

U.S. Pat. No. 6,440,813 filed Jan. 23, 2001 to Collins et al. discloses a trench capacitor having an increased surface area. The trench capacitor is a dual trench capacitor having a first trench and a second trench wherein inner walls of the trenches electrically connect.

U.S. Pat. No. 6,448,131 filed Aug. 14, 2001 to Cabral, et al. discloses a method for increasing the trench capacitor surface area. The method utilizes a metal silicide to roughen the trench walls. The capacitance is increased due to the increase in the trench surface area after the silicide has been removed.

SUMMARY OF INVENTION

The primary objective of the present invention is to provide a novel trench capacitor structure with enlarged capacitor surface.

In accordance with the invention, a trench capacitor having a large capacitor surface area is provided. The trench capacitor includes a buried diffusion plate doped in a substrate and encompassing a bottle-shaped lower portion of the trench capacitor. The buried diffusion plate is electrically connected to an upwardly extending cylindrical center electrode via a bottom contact surface of the bottle-shaped lower portion. The buried diffusion plate and the upwardly extending cylindrical center electrode serve as a first electrode of said trench capacitor. A first insulation layer is disposed on interior surface of the bottle-shaped lower portion of said trench capacitor except for the bottom contact surface. An outer electrode layer is situated on the first insulation layer and encircles the cylindrical center electrode. A second insulation layer is disposed between the outer electrode layer and the cylindrical center electrode. A central pillar electrode downwardly extends along the length of the cylindrical center electrode. The cylindrical center electrode encircles the central pillar electrode. A third insulation layer is disposed between the central pillar electrode and the cylindrical center electrode. A collar electrode layer is located on the central pillar electrode and on the outer electrode layer. The collar electrode layer is electrically connected to the central pillar electrode and the outer electrode layer. The collar electrode layer, the central pillar electrode and the outer electrode layer constitute a second electrode of the trench capacitor.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Please refer to FIG. 1 to FIG. 14. FIG. 1 to FIG. 14 are schematic cross-sectional diagrams showing the fabrication process of making a trench capacitor according to one preferred embodiment of the present invention. It is to be understood that the steps for making a bottle-shaped trench as will be seen in FIG. 1 through FIG. 4 is only exemplary. Any other approaches known by those skilled in the art may also be used.

Figure 1:
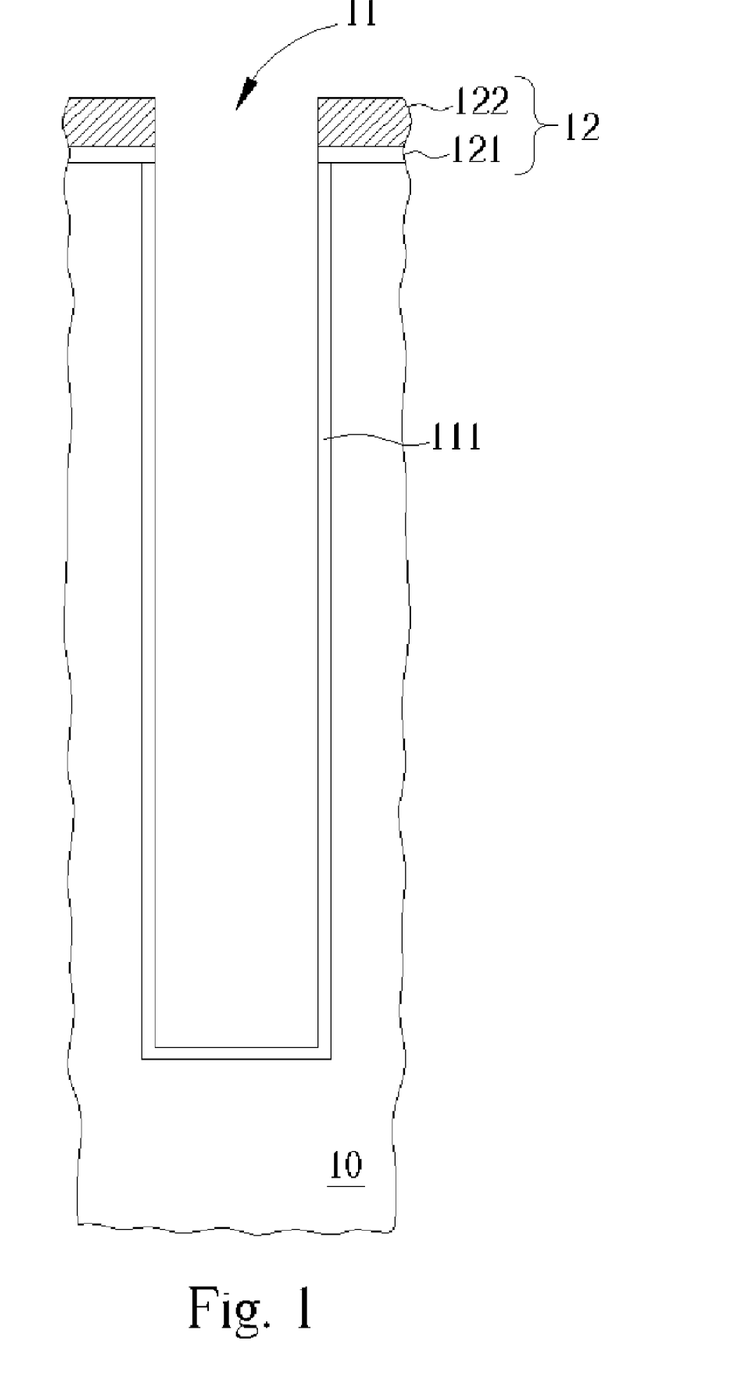
FIG. 1 is a cross-sectional view of a semiconductor substrate illustrating the steps of forming a trench structure on a semiconductor substrate.

As shown in FIG. 1, a deep trench 11 is etched into a semi-conductor substrate 10 such as a silicon substrate or the like. The method of making the deep trench 11 in a semi-conductor substrate is known in the art. For example, a conventional lithographic process is used to define a trench opening in a photoresist, and a dry etching such as reactive ion etching (RIE) is then carried out to etch the pad layer 12 and the substrate 10 through the trench opening to a depth of about 7~8 micrometers below the surface of the substrate 10. The deep trench 11 comprises a vertical sidewall and bottom surface. The pad layer 12 may comprise a pad nitride and a pad oxide. In this embodiment, the pad layer 12 consists of a pad oxide 121 and a pad nitride 122. It is to be understood that the surface of the substrate 10 hereinafter refers to as the interface between the pad oxide 121 and the substrate 10. After the formation of the deep trench 11, an oxidation process is carried out to form a silicon oxide film 111 on sidewall and bottom surface of the deep trench 11.

Figure 2:
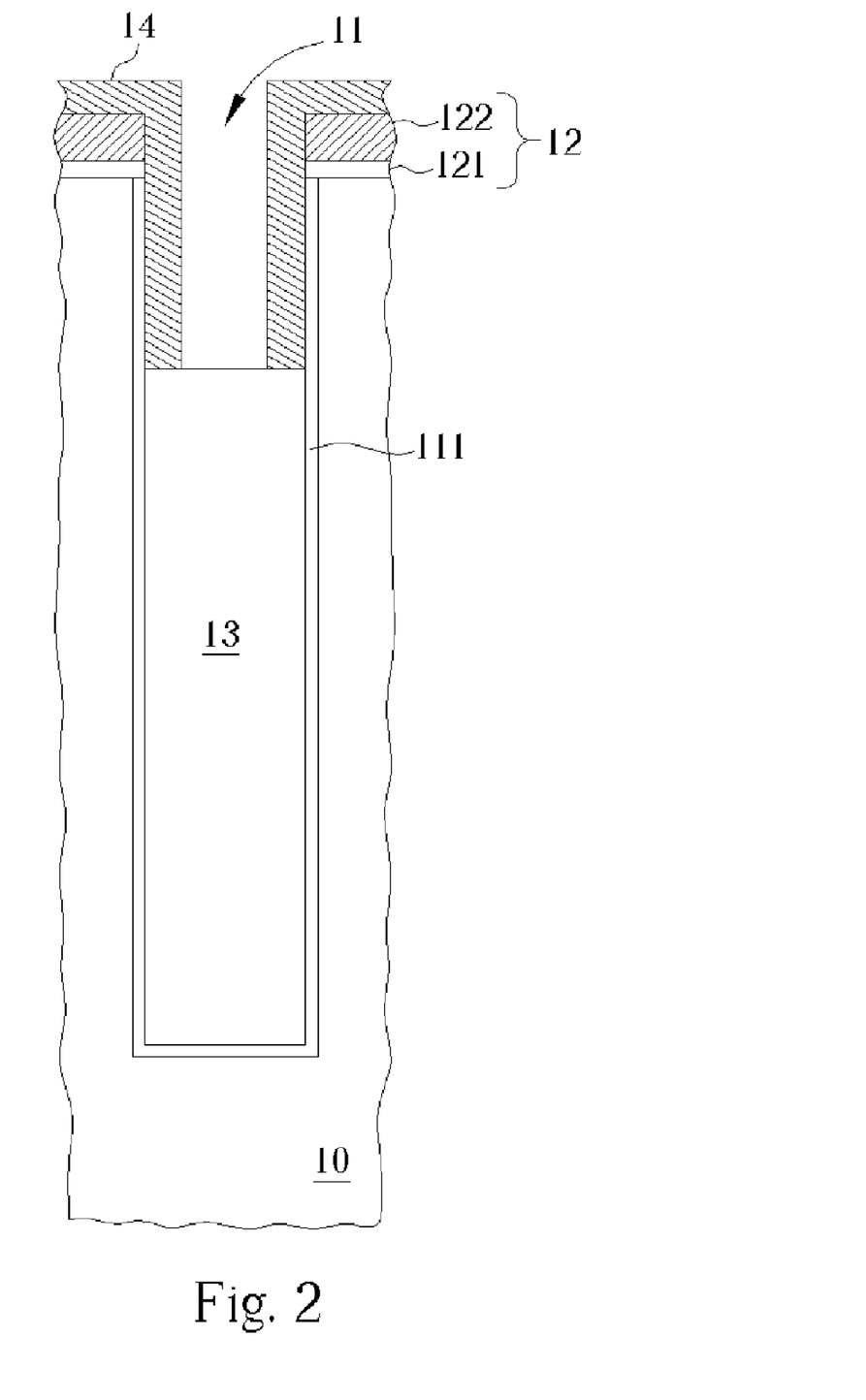
FIGS. 2 and 3 are cross-sectional views of a semiconductor substrate illustrating the steps of forming a silicon nitride mask layer on an upper portion of the trench structure.

As shown in FIG. 2, a sacrificial layer 13 such as a photoresist is deposited in the deep trench 11 with a top surface of the sacrificial layer 13 being at a predetermined depth below the surface of the substrate 10. At this stage, an upper annular portion of the silicon oxide film 111 on the deep trench sidewall is exposed. A selective deposition process such as a selective liquid phase nitride or oxide known in the art is then carried out to selectively deposit a silicon nitride mask layer 14 on the exposed annular portion of the silicon oxide film 111 and on the pad nitride 122.

Figure 3:
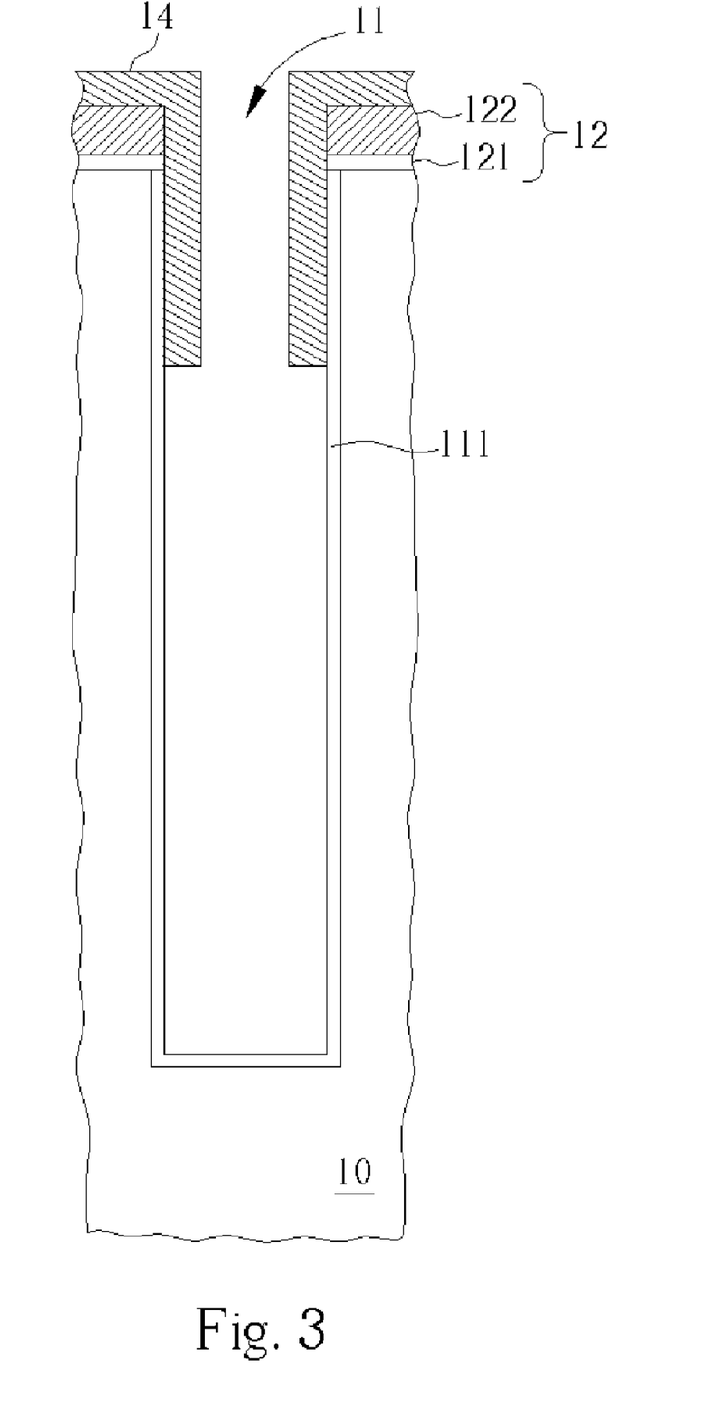
Figure 4:
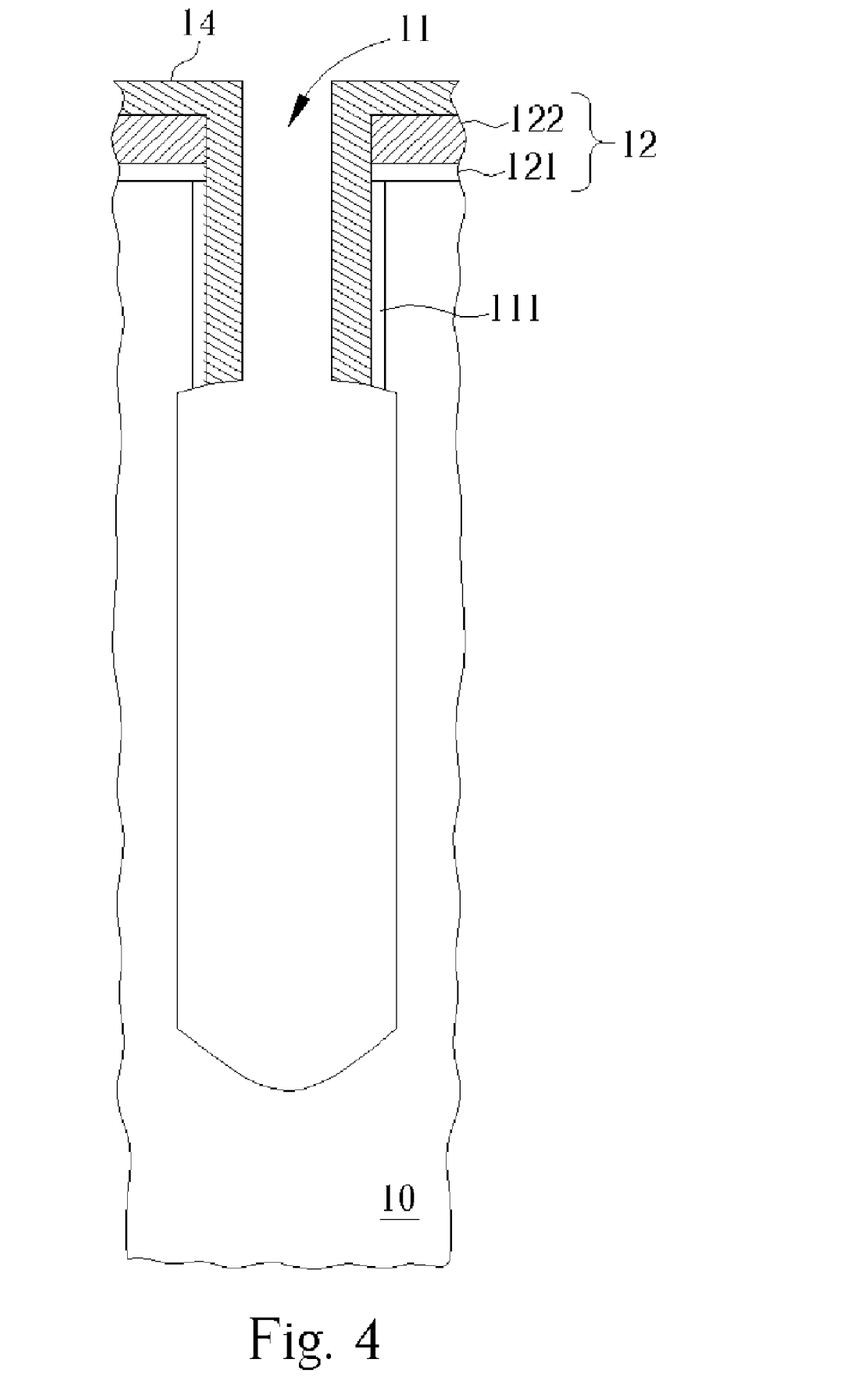
FIG. 4 is a cross-sectional view of a semiconductor substrate illustrating the steps of forming a bottle-shaped lower portion of the trench structure.

As shown in FIG. 3, the sacrificial layer 13 is then stripped off. The silicon nitride mask layer 14 is left in place to cover the upper annular portion of the silicon oxide film 111 on the deep trench sidewall. Preferably, a rapid thermal process (RTP) may be carried out after stripping the sacrificial layer 13 to densify the silicon nitride mask layer 14. As shown in FIG. 4, an isotropic wet etching such as DHF/NH$_4$OH wet chemistry is used to etch away the silicon oxide film 111 that is not covered by the silicon nitride mask layer 14. The wet etching continues to etch the sidewall/bottom surface of the deep trench 11, thereby forming a bottle-shaped lower portion of the deep trench. As specifically indicated, the bottle-shaped deep trench has a widened lower portion and a narrowing neck channel.

Figure 5:
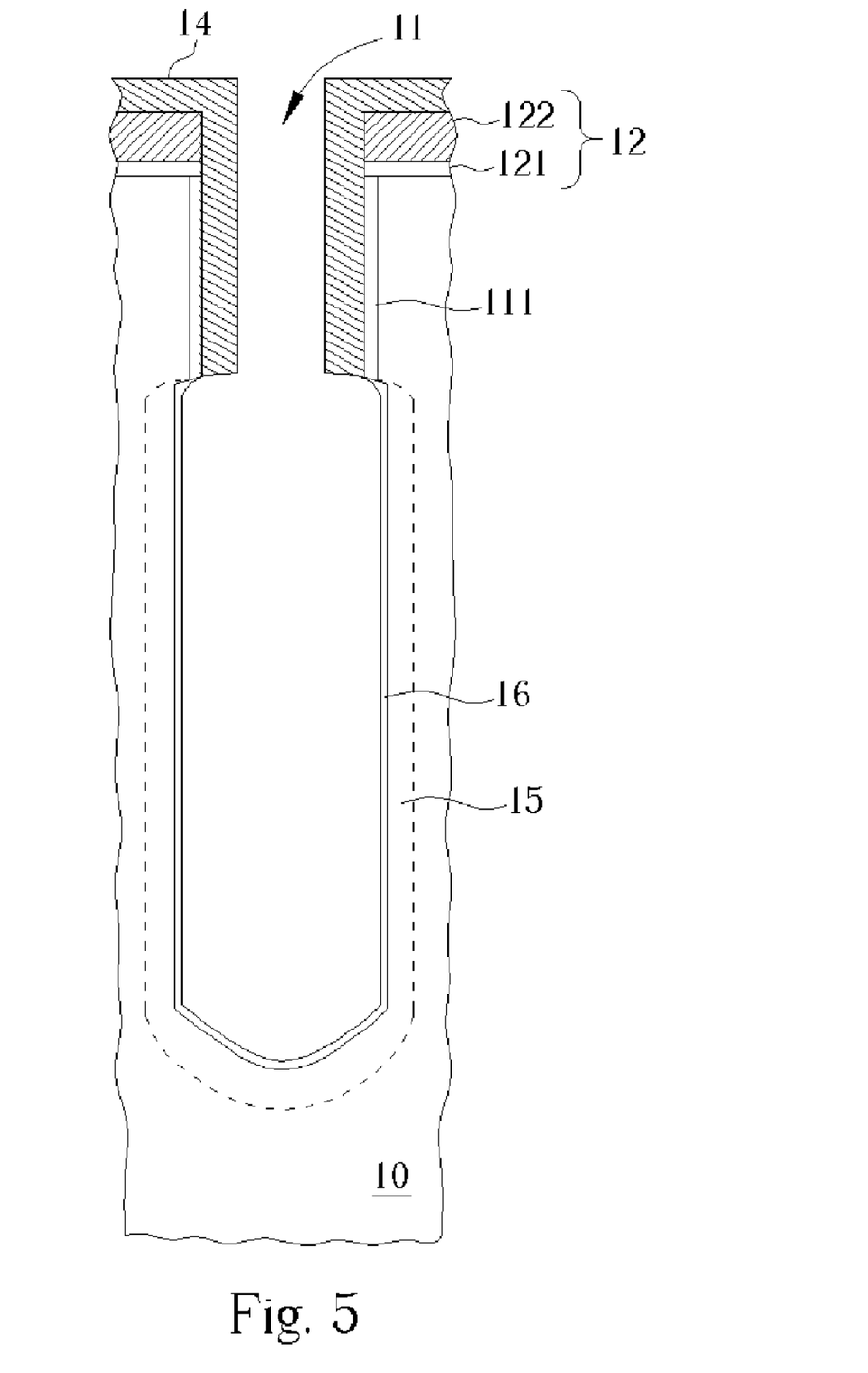
FIG. 5 is a cross-sectional view of a semiconductor substrate illustrating the steps of forming a buried plate and first node dielectric in the trench structure.

As shown in FIG. 5, the bottle-shaped lower portion of the deep trench is doped by using doping methods such as Gas Phase Doping (GPD), Arsenic-doped Silicate Glass (ASG), or other approaches known in the art so as to form a diffusion region 15 that is referred to as "buried plate" serving as the first electrode (or bottom electrode) of the trench capacitor.

In one embodiment in which the ASG method is employed, after the ASG film is coated, a thermal process is usually carried out at high temperatures to "drive in" the dopants (arsenic) of the ASG film into the substrate 10. Subsequently, a node dielectric film 16, such as a nitride-oxide (NO) or oxide-nitride-oxide (ONO), but not limited thereto, is formed on the exposed interior surface of the bottle-shaped deep trench. In other embodiments, the node dielectric film 16 may be made of high-k (dielectric constant) materials such as oxynitride, $Al_2O_3$, $HfO_2$, or $(Al_2O_3)_x/(HfO_2)_y$. In another case, the bottom electrode of the trench capacitor may further comprise a metal layer lining the top surface of the diffusion region 15. This metal layer may be TiN/TaN, tungsten, etc.

Figure 6:
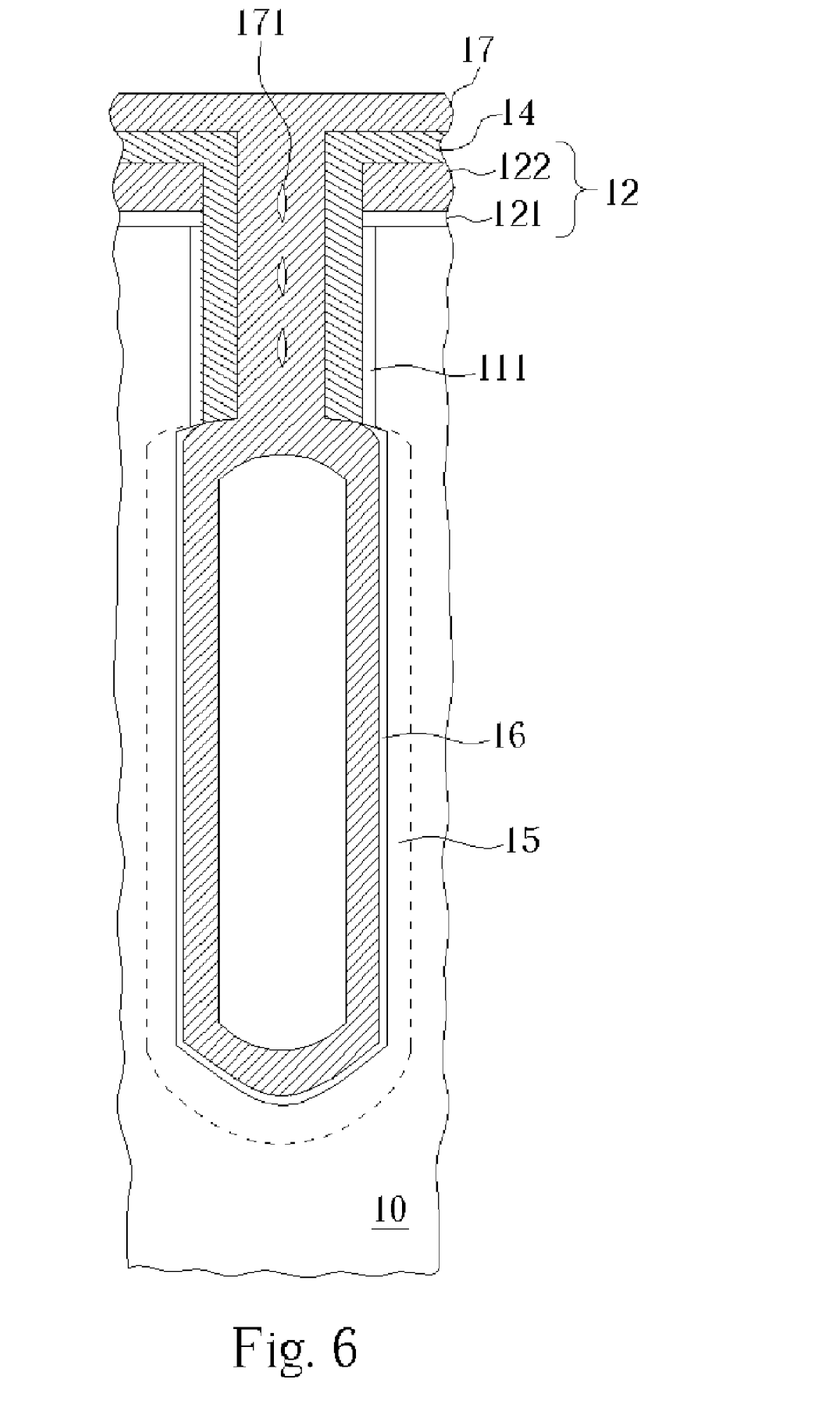
FIGS. 6 and 7 are cross-sectional views of a semiconductor substrate illustrating the steps of forming a polysilicon outer electrode on sidewall of the bottle-shaped lower portion of the trench structure.

As shown in FIG. 6, a chemical vapor deposition (CVD) process is carried out to deposit a polysilicon layer 17 on the node dielectric film 16. The polysilicon layer 17 has a thickness of about 200~400 angstroms, preferably 300 angstroms. In this embodiment, as specifically indicated, the 300-angstrom thick polysilicon layer 17 may clog the narrowing neck channel of the bottle-shaped deep trench and voids 171 may be found at the neck channel of the bottle-shaped deep trench. It is noted that the polysilicon layer 17 does not fill the widened lower portion of the bottle-shaped deep trench. The polysilicon layer 17 may be thicker in a case that the dimension of the deep trench is larger. In one embodiment, the polysilicon layer 17 may be replaced with other suitable conductive materials such as metals or alloys.

Figure 7:
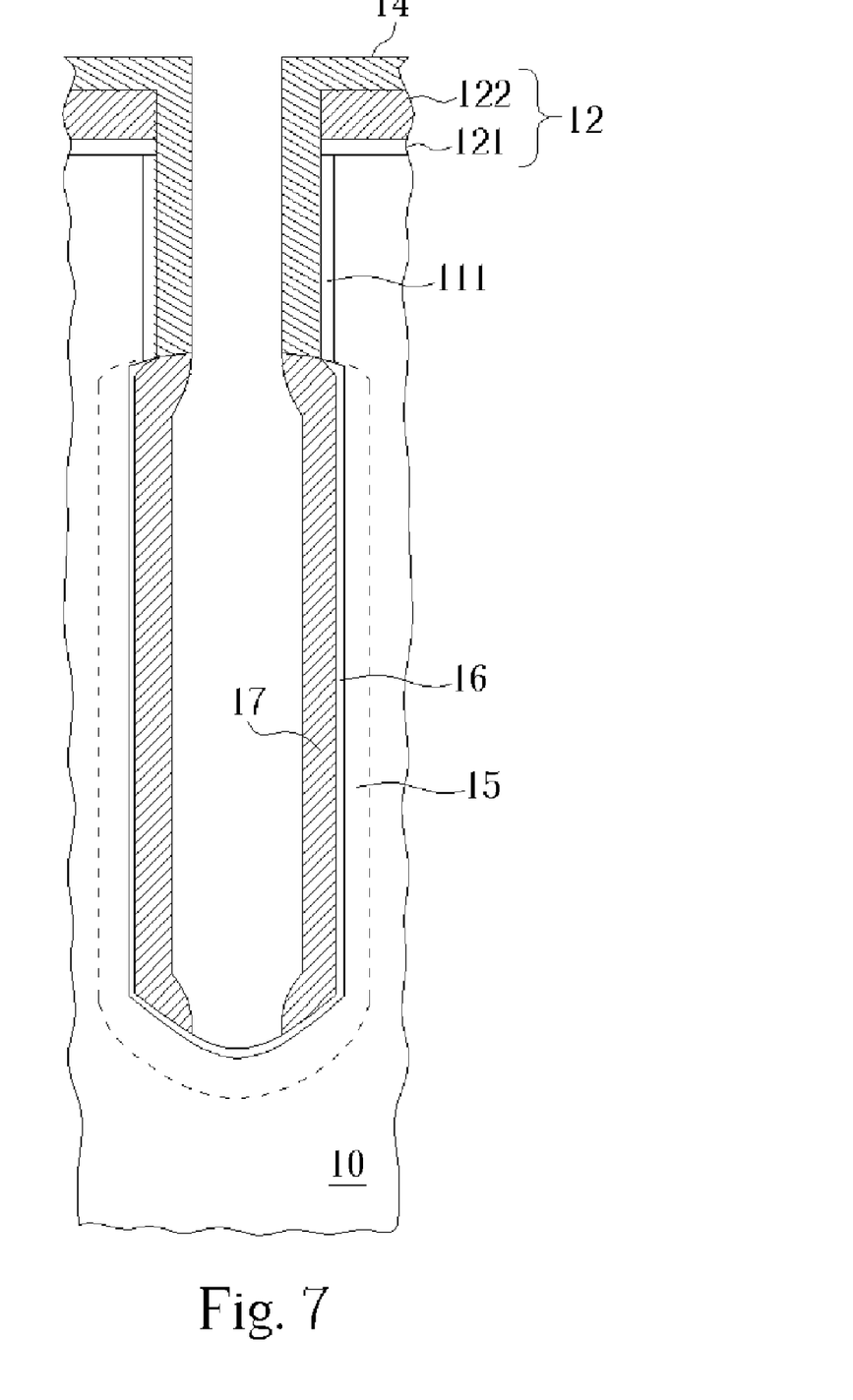

As shown in FIG. 7, an anisotropic dry etching process is then performed to etch the polysilicon layer 17 so as to open the clogged neck channel of the bottle-shaped deep trench. After etching through the polysilicon layer 17 at the neck channel of the bottle-shaped deep trench, the anisotropic dry etching process continues to etch the polysilicon layer 17 located at the bottom of the deep trench 11 and stops on the node dielectric film 16.

Figure 8:
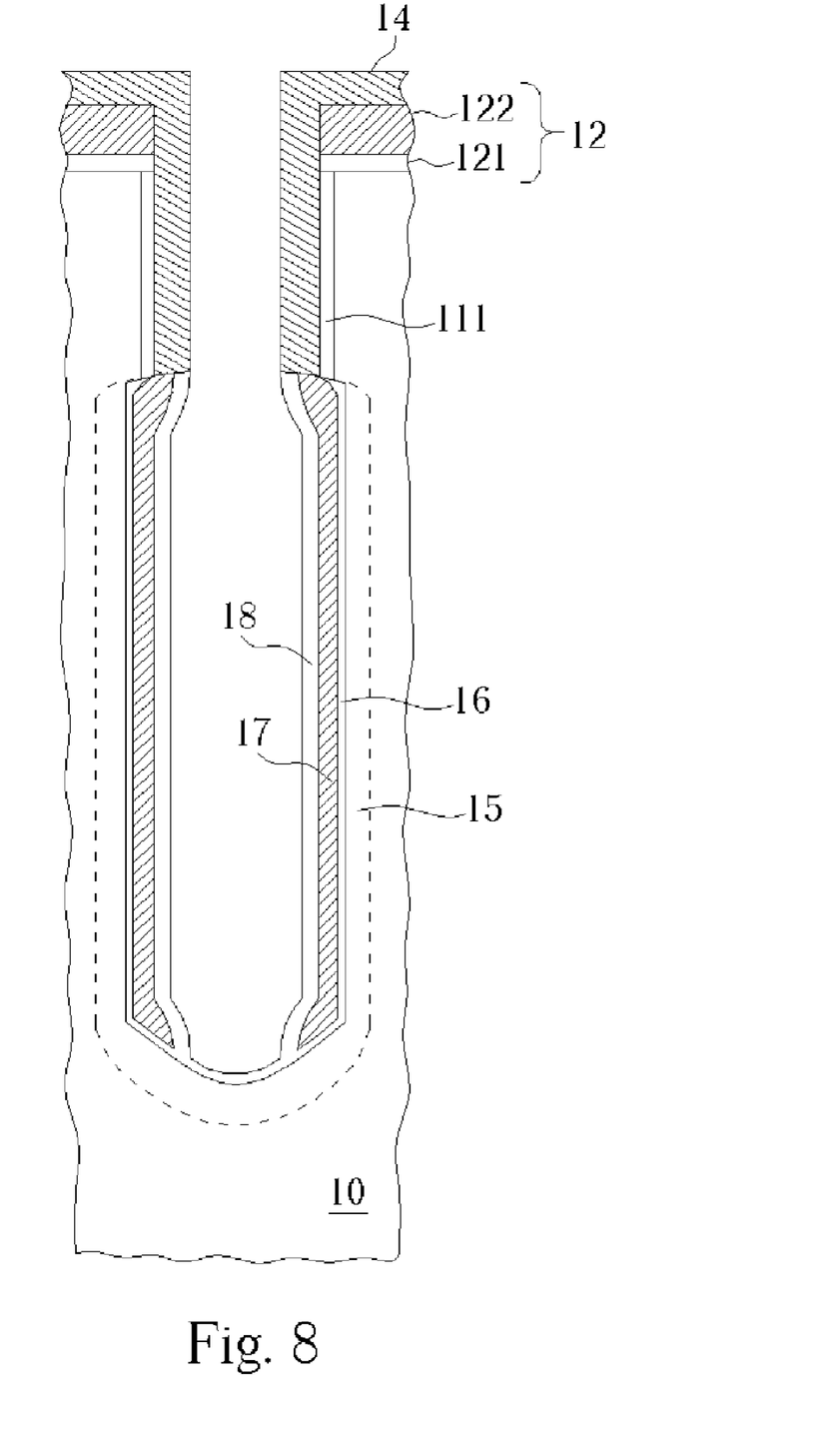
FIG. 8 is a cross-sectional view of a semiconductor substrate illustrating the steps of forming a thermal oxide layer on the polysilicon outer electrode on sidewall of the bottle-shaped lower portion of the trench structure.

As shown in FIG. 8, a thermal oxidation process is then performed to oxidize the exposed surface of the remaining polysilicon layer 17 so as to form an insulation layer 18 having a thickness of about 150~200 angstroms. The insulation layer 18 may comprise silicon dioxide, $Al_2O_3$, $HfO_2$, or other dielectric materials with higher dielectric constants. In other embodiments, the insulation layer 18 may be deposited by atomic layer deposition (ALD) method or CVD methods.

Figure 9:
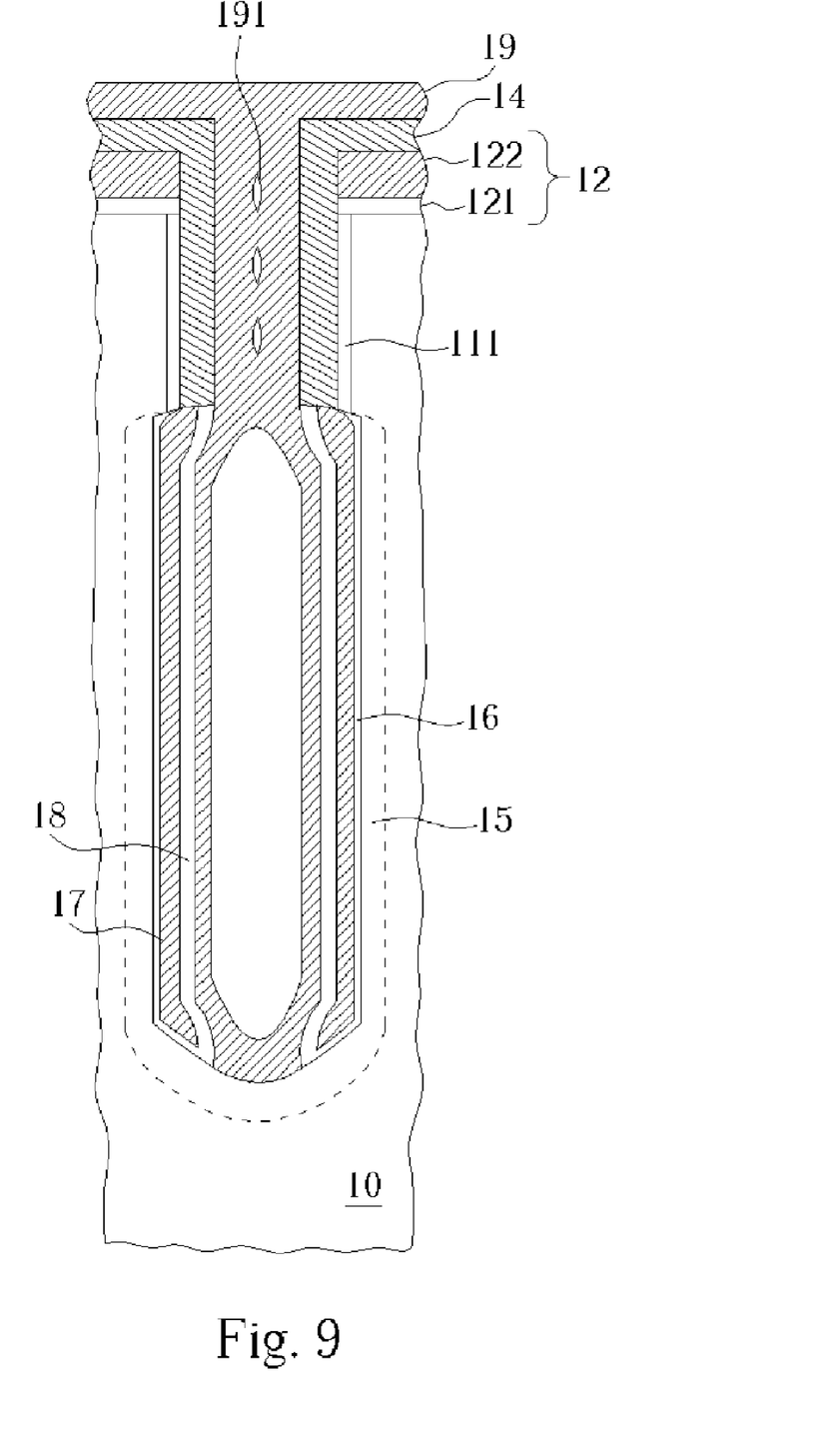
FIGS. 9 and 10 are cross-sectional views of a semiconductor substrate illustrating the steps of removal of a portion of the first node dielectric at the bottom contact surface of the bottle-shaped lower portion of the trench structure and the formation of an upwardly extending cylindrical center electrode.

As shown in FIG. 9, the exposed node dielectric film 16 at the bottom of the deep trench 11 is then etched away selective to the insulation layer 18, thereby exposing a portion of the silicon surface at the bottom of the deep trench 11. More specifically, a portion of the diffusion region or buried plate 15 is exposed. The removal of the exposed node dielectric film 16 at the bottom of the deep trench 11 may be accomplished by using an anisotropic dry etching or selective wet etching processes known in the art. Subsequently, a polysilicon CVD process is performed to deposit a polysilicon layer 19 in the deep trench 11. The polysilicon layer 19 is deposited on the insulation layer 18 and on the exposed buried plate 15 at the bottom of the deep trench 11. Preferably, the polysilicon layer 19 has a thickness of about 200~300, more preferably 250 angstroms. In this preferably embodiment, the polysilicon layer 19 having a thickness of about 250 angstroms may again clog the narrowing neck channel of the deep trench structure. Likewise, voids 191 may be observed at the clogged neck channel. It is noted that the polysilicon layer 19 does not fill the deep trench, more specifically, the lower widened portion of the bottle-shaped deep trench. The polysilicon layer 19 may be thicker in a case that the dimension of the deep trench is larger. In one embodiment, the polysilicon layer 19 may be replaced with other suitable conductive materials such as metals or alloys.

Figure 10:
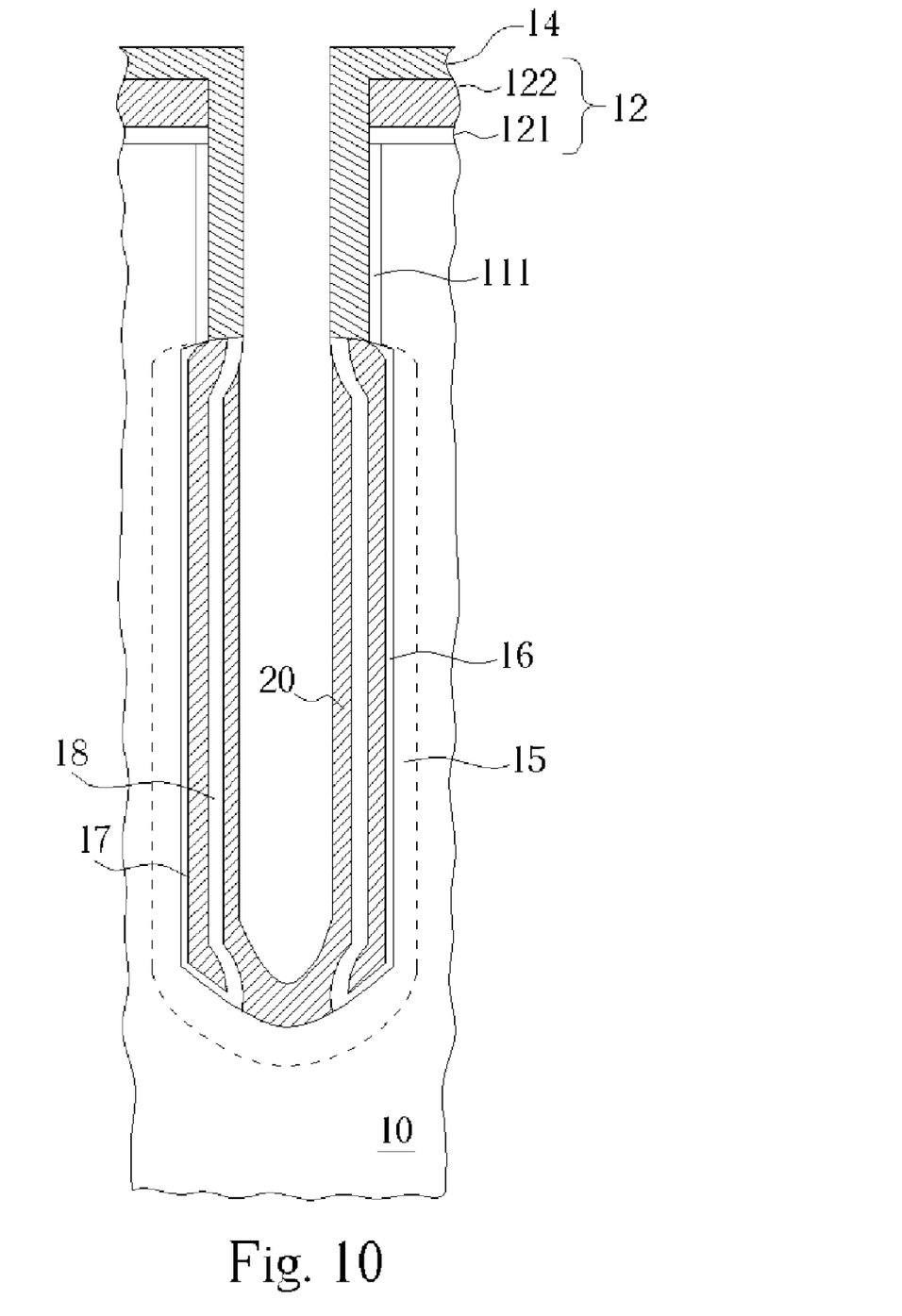

As shown in FIG. 10, an anisotropic dry etching process is then performed to etch the polysilicon layer 19 so as to open the clogged neck channel of the bottle-shaped deep trench. After etching through the polysilicon layer 19 at the neck channel of the bottle-shaped deep trench, the anisotropic dry etching process stops, thereby forming an upwardly extending polysilicon electrode 20 having a substantially cylindrical shape within the deep trench 11. The bottom of the upwardly extending polysilicon electrode 20 is electrically connected to the buried plate 15 and is electrically isolated from the surrounding polysilicon layer 17 by the insulation layer 18. The buried plate 15 and the upwardly extending polysilicon electrode 20 electrically connected with the buried plate 15 constitute a large-area capacitor electrode.

Figure 11:
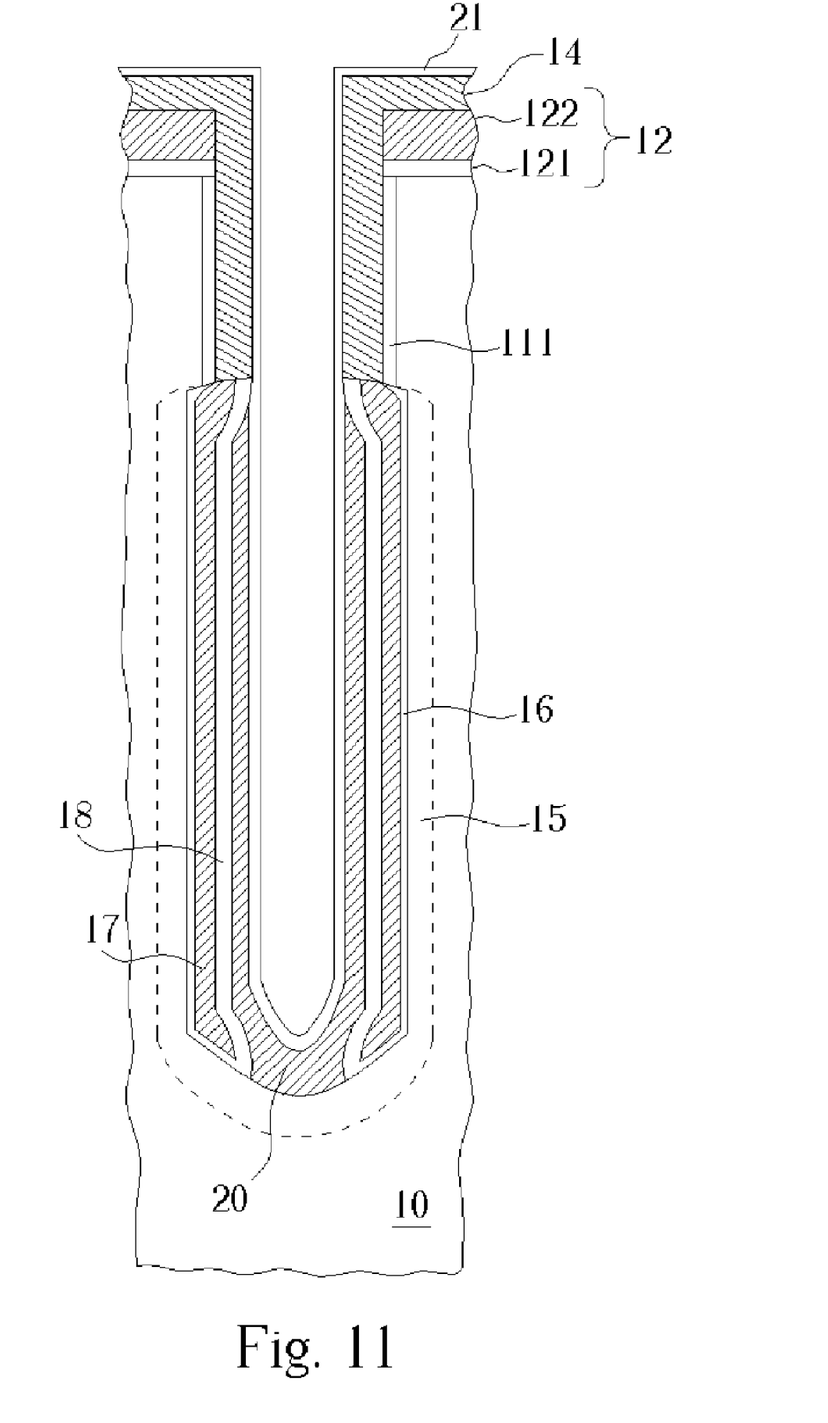
FIG. 11 is a cross-sectional view of a semiconductor substrate illustrating the steps of forming a second node dielectric.

As shown in FIG. 11, a node dielectric film 21 such as NO or ONO is formed on the surface of the polysilicon electrode 20 and on the surface of the silicon nitride mask layer 14. In this embodiment, the node dielectric film 21 is NO film. The node dielectric film 21 may be formed by a Rapid Thermal Nitride (RTN) method, or conventional nitride deposition followed by thermal oxidation. In other embodiments, the node dielectric film 21 may be made of other high-k materials such as oxynitride, $Al_2O_3$, $HfO_2$, $Ta_2O_5$, $ZrO_2$, or $(Al_2O_3)_x/(HfO_2)_y$.

Figure 12:
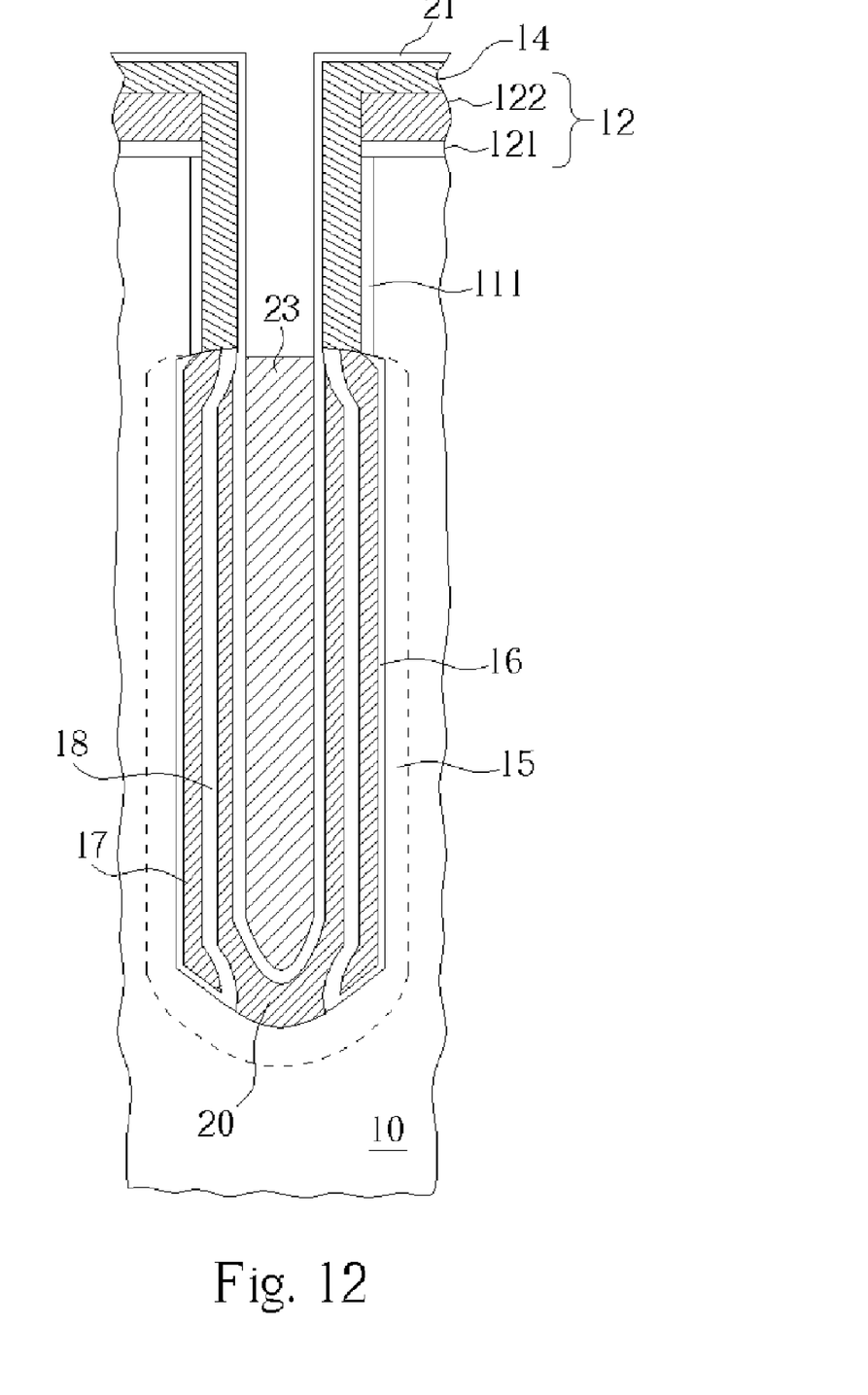
FIG. 12 is a cross-sectional view of a semiconductor substrate illustrating the steps of forming a central pillar electrode on the second node dielectric at the bottle-shaped lower portion of the trench structure.

As shown in FIG. 12, a polysilicon CVD process is carried out to deposit a polysilicon layer 23 in the deep trench 11. The polysilicon layer 23 is initially deposited to fill the rest spacing of the deep trench 11 and cover the silicon nitride mask layer 14 outside the deep trench 11, and then recessed to a predetermined depth below the surface of the substrate 10. In this embodiment, the polysiliocn layer 23 is recessed to a level between the neck portion and the widened lower portion of the deep trench. In another embodiment, the polysilicon layer 23 may be replaced with a metal layer such as TiN, TaN, tungsten, etc. In still another embodiment, the polysilicon layer 23 may be replaced with a dual layer consisting of a poly film and a metal film, in which the poly film has a thickness that is greater that that of the metal film. In still another embodiment, the polysilicon layer 23 may be replaced with a dual layer consisting of two different metal layers.

Figure 13:
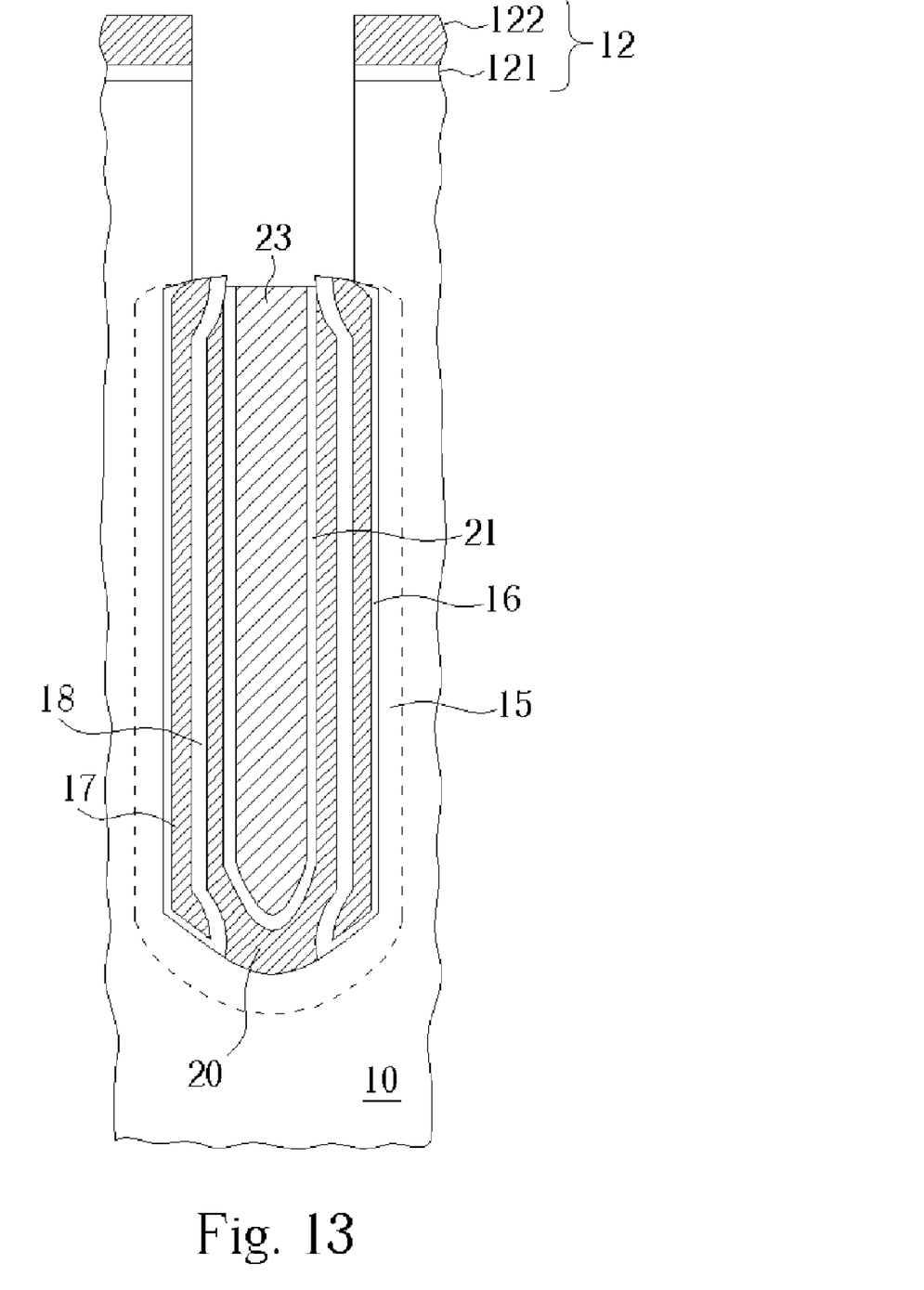
FIG. 13 is a cross-sectional view of a semiconductor substrate illustrating the steps of removal of a portion of the second node dielectric and removal of the silicon nitride mask layer.

As shown in FIG. 13, the exposed node dielectric film 21 that is not covered by the polysiliocn layer 23 is removed. The silicon nitride mask layer 14 and the silicon oxide layer 111 are then stripped off by using wet etching such as HF/EG chemistry known in the art, thereby exposing a top portion of the polysilicon layer 17.

Figure 14:
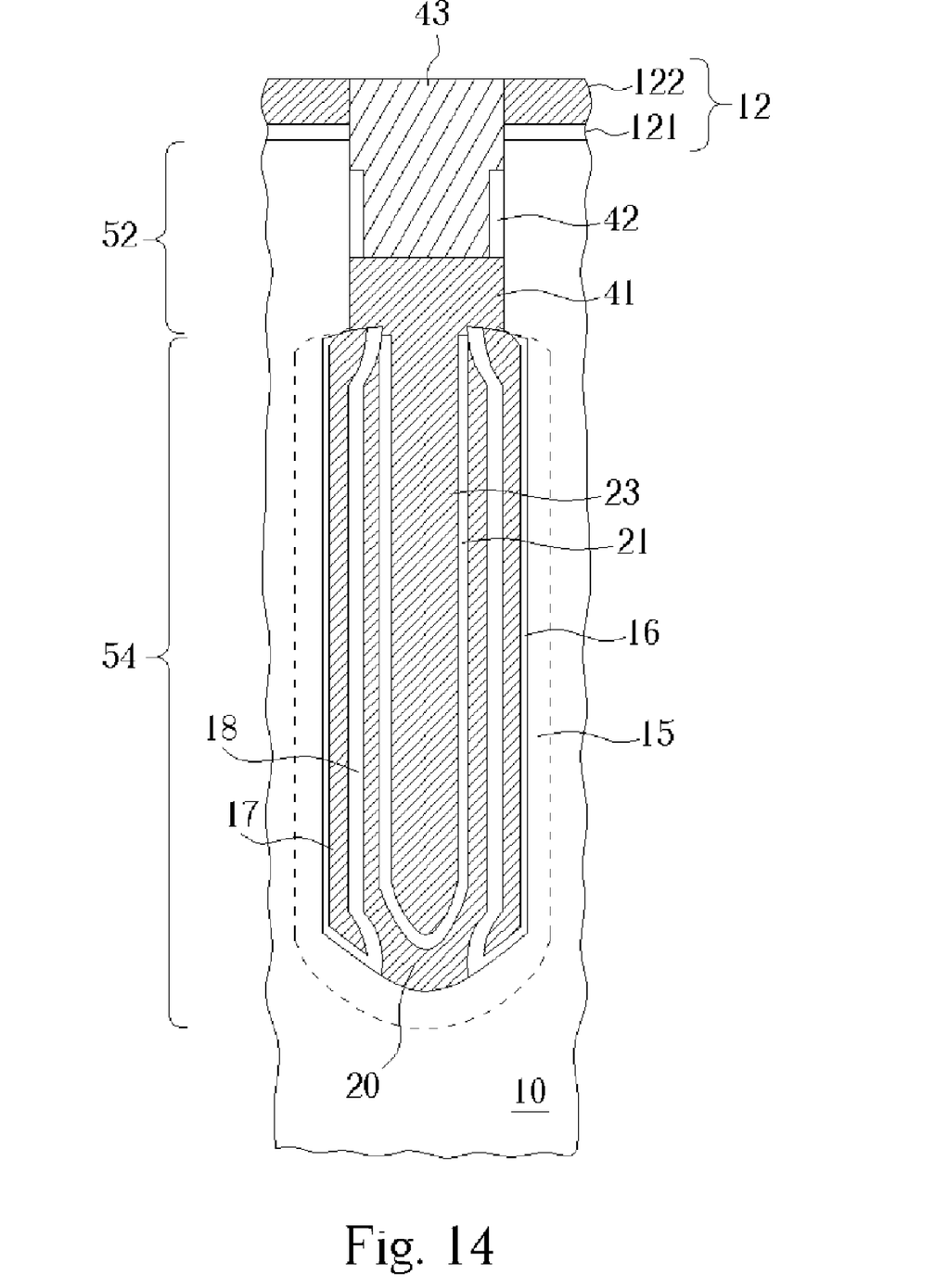
FIG. 14 is a cross-sectional view of a semiconductor substrate illustrating the steps of forming collar electrode and collar oxide.

As shown in FIG. 14, the deep trench 11 is then filled with another layer of polysilicon (not shown) and then recessed to a predetermined depth below the surface of the substrate 10, thereby forming a polysilicon layer 41 electrically connecting the polysiliocn layer 23 and the polysilicon layer 17. The polysilicon layer 41, polysiliocn layer 23 and the polysilicon layer 17 together constitute a storage node electrode of the trench capacitor, which is electrically isolated from the upwardly extending polysilicon cylindrical electrode 20 by the insulation layer 18 and the node dielectric film 21, and is electrically isolated from the buried plate 15 by the node dielectric film 16. Thereafter, a collar oxide layer 42 is formed on sidewall of the upper deep trench above the polysilicon layer 41. The method of forming the collar oxide layer 42, which is known by those skill in the art, includes the steps of depositing a conformal silicon oxide layer, dry etching the silicon oxide layer, forming a sacrificial layer on the silicon oxide layer, recessing the sacrificial layer to a depth, removing the exposed silicon oxide layer, and removing the remaining sacrificial layer. Finally, the rest spacing of the deep trench 11 is filled with a polysilicon layer 43 that is electrically connected to the polysilicon layer 41. A conventional Chemical Mechanical Polishing (CMP) may be carried out to obtain planar substrate topography using the pad nitride 122 as a polishing stop layer.

In another embodiment, the polysilicon layer 43 may be replaced with a metal layer such as TiN, TaN, tungsten, etc. In still another embodiment, the polysilicon layer 43 may be replaced with a dual layer consisting of a poly film and a metal film, in which the poly film has a thickness that is greater that that of the metal film. In still another embodiment, the polysilicon layer 43 may be replaced with a dual layer consisting of two different metal layers.

To sum up, still referring to FIG. 14, the present invention large-area trench capacitor structure comprises a capacitor neck portion 52 and a lower bottle portion 54. The large-area trench capacitor structure comprises a diffusion region or buried plate 15 formed in the substrate 10 and adjacent to the deep trench 11. The buried plate 15, which substantially encompasses the lower bottle portion 54 in the preferred embodiment, is electrically connected to an upwardly extending polysilicon electrode 20 having a substantially cylindrical shape within the deep trench 11. The polysilicon electrode 20 is cylindrical and extends along the depth of the lower bottle portion 54. The first electrode of the trench capacitor consists of the buried plate 15 and the upwardly extending polysilicon electrode 20. The second electrode (storage node electrode) of the trench capacitor consists of the polysilicon layers 41, 17, and 23. The upwardly extending polysilicon electrode 20 is surrounded by the polysilicon layers 41, 17, and 23. The first electrode and the second electrode of the trench capacitor are isolated from each other by means of the node dielectric film 16, insulation layer 18, and node dielectric film 21.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A trench capacitor having a large capacitor surface area, comprising:
   a buried diffusion plate doped in a substrate and encompassing a bottle-shaped lower portion of said trench capacitor, said buried diffusion plate being electrically connected to an upwardly extending cylindrical center electrode via a bottom contact surface of said bottle-shaped lower portion, wherein said buried diffusion plate and said upwardly extending cylindrical center electrode serve as a first electrode of said trench capacitor;
   a first insulation layer disposed on interior surface of said bottle-shaped lower portion of said trench capacitor except for said bottom contact surface;
   an outer electrode layer situated on said first insulation layer and encircling said cylindrical center electrode;
   a second insulation layer disposed between said outer electrode layer and said cylindrical center electrode;
   a central pillar electrode downwardly extending along the length of said cylindrical center electrode and encompassed by said cylindrical center electrode;

a third insulation layer disposed between said central pillar electrode and said cylindrical center electrode; and a collar electrode layer located on said central pillar electrode and on said outer electrode layer, said collar electrode layer being electrically connected to said central pillar electrode and said outer electrode layer, wherein said collar electrode layer, said central pillar electrode and said outer electrode layer constitute a second electrode of said trench capacitor.

2. The trench capacitor according to claim 1 wherein said cylindrical center electrode upwardly extends along the length of said bottle-shaped lower portion of said trench capacitor.

3. The trench capacitor according to claim 1 wherein said trench capacitor further comprises a capacitor neck portion above said bottle-shaped lower portion of said trench capacitor.

4. The trench capacitor according to claim 3 wherein said trench capacitor further comprises a collar oxide layer situated on sidewall of said capacitor neck portion.

5. The trench capacitor according to claim 1 wherein said buried diffusion plate is covered by a metal layer, and said buried diffusion plate and said metal layer serving as the first electrode of said trench capacitor.

6. The trench capacitor according to claim 1 wherein said buried diff-usion plate is an $N^+$ diffusion plate.

7. The trench capacitor according to claim 6 wherein said $N^+$ diffusion plate is doped by Gas Phase Doping (GPD) method.

8. The trench capacitor according to claim 6 wherein said $N^+$ diffusion plate is doped by Arsenic-doped Silicate Glass (ASG).

9. The trench capacitor according to claim 1 wherein said cylindrical center electrode is made of polysilicon or metals.

10. The trench capacitor according to claim 1 wherein said collar electrode layer, said central pillar electrode and said outer electrode layer are made of polysilicon or metals.

11. The trench capacitor according to claim 1 wherein said first insulation layer is made of dielectric material selected from the group consisting of silicon nitride, oxynitride, ONO, NO, $Al_2O_3$, $HfO_2$, $Ta_2O_5$, $ZrO_2$, and $(Al_2O_3)_x/(HfO_2)_y$.

12. The trench capacitor according to claim 1 wherein said the second insulation layer comprises silicon oxide, $Al_2O_3$, $HfO_2$, and any suitable dielectric films.

13. The trench capacitor according to claim 11 wherein said the second insulation layer is a thermally formed silicon dioxide layer.

14. The trench capacitor according to claim 11 wherein said the second insulation layer is deposited by atomic layer deposition (ALD) method.

15. The trench capacitor according to claim 11 wherein said the second insulation layer is deposited by chemical vapor deposition (CVD) method.

16. The trench capacitor according to claim 1 wherein said third insulation layer is made of dielectric material selected from the group consisting of silicon nitride, oxynitride, ONO, NO, $Al_2O_3$, $HfO_2$, $Ta_2O_5$, $ZrO_2$, and $(Al_2O_3)_x/(HfO_2)_y$.

17. A trench capacitor, comprising:
a first electrode embedded in a deep trench and comprising a collar electrode layer, a central pillar electrode and an outer electrode layer;

a second electrode isolated from said first electrode by at least one dielectric film, said second electrode comprising an upwardly extending hollowed-cylindrical center electrode electrically connected to a buried diffusion plate via a bottom contact surface of a bottle-shaped lower portion of said deep trench, wherein said central pillar electrode encompassed by the upwardly extending hollowed-cylindrical center electrode, and said buried diffusion plate encompasses said bottle-shaped lower portion of said deep trench; and wherein said outer electrode layer encircles said upwardly extending cylindrical center electrode of said second electrode, and said upwardly extending cylindrical center electrode of said second electrode encircles said central pillar electrode of said first electrode.

18. The trench capacitor according to claim 17 wherein said deep trench further comprises a neck channel above said bottle-shaped lower portion and said collar electrode layer is embedded in said neck channel.

19. The trench capacitor according to claim 17 wherein said central pillar electrode and said outer electrode layer are formed within said bottle-shaped lower portion of said deep trench.

20. The trench capacitor according to claim 17 wherein said collar electrode layer is electrically connected to said central pillar electrode and said outer electrode layer.

21. The trench capacitor according to claim 17 wherein said bottom electrode comprises a buried diffusion layer.

22. The trench capacitor according to claim 17 wherein said bottom electrode comprises a buried diffusion layer and a metal layer.

* * * * *